(12) United States Patent
Yoon et al.

(10) Patent No.: US 8,347,183 B2
(45) Date of Patent: Jan. 1, 2013

(54) FLASH MEMORY DEVICE USING ECC ALGORITHM AND METHOD OF OPERATING THE SAME

(75) Inventors: Chi-weon Yoon, Seoul (KR); Chae-hoon Kim, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 787 days.

(21) Appl. No.: 12/486,875

(22) Filed: Jun. 18, 2009

(65) Prior Publication Data

US 2009/0327839 A1  Dec. 31, 2009

(30) Foreign Application Priority Data

Jun. 25, 2008  (KR) .................. 10-2008-0060223

(51) Int. Cl.
*H03M 13/00* (2006.01)

(52) U.S. Cl. .................. 714/766; 714/785; 714/752

(58) Field of Classification Search .................. 714/766, 714/785, 752, 765, 773, 763, 755; 711/102
See application file for complete search history.

(56) References Cited

U.S. PATENT DOCUMENTS

| 7,562,183 | B2 * | 7/2009 | Kwon | 711/103 |
| 2006/0031593 | A1 * | 2/2006 | Sinclair | 709/251 |
| 2008/0028133 | A1 * | 1/2008 | Kwon | 711/103 |
| 2008/0082736 | A1 * | 4/2008 | Chow et al. | 711/103 |
| 2009/0113272 | A1 * | 4/2009 | Tan et al. | 714/765 |

FOREIGN PATENT DOCUMENTS

| JP | 2000-348497 | 12/2000 |
| KR | 10-0486132 | 4/2005 |
| KR | 1020060022144 | 3/2006 |

\* cited by examiner

*Primary Examiner* — Fritz Alphonse
(74) *Attorney, Agent, or Firm* — F. Chau & Associates, LLC

(57) ABSTRACT

A flash memory device using an error correction code (ECC) algorithm and a method of operating the same. The device includes a memory cell array including a error correction code (ECC) block including data memory cells configured to store data and a parity cell configured to store a first parity code, a parity controller configured to generate a second parity code based on a the current operating mode of the flash memory device, and an error correction unit configured to receive one of the first and second parity codes and to perform an ECC algorithm on the data stored in the data memory cells using the received parity code. A control logic restarts an erase operation on an erroneously unerased data memory cell or prevents the erase operation from being restarted based on the number of erroneous bits per ECC block.

20 Claims, 6 Drawing Sheets

FLASH MEMORY DEVICE USING ECC ALGORITHM AND METHOD OF OPERATING THE SAME

CROSS-REFERENCE TO RELATED APPLICATIONS

This application claims the benefit, under 35 U.S.C. §119, of Korean Patent Application No. 10-2008-0060223, filed on Jun. 25, 2008, in the Korean Intellectual Property Office, which is incorporated by reference herein in its entirety.

BACKGROUND

1. Field of the Invention

The present invention relates to flash memory devices, and more particularly, to a flash memory device using an error correction code (ECC) algorithm.

2. Description of the Related Art

The demand for flash memory devices, which are nonvolatile memory devices, has increased with the popularity of mobile computer systems, cell phones, MP3 players and various other consumer electronics. A flash memory device is electrically programmable and erasable, and can retain data even if power supply is interrupted.

Flash memory devices include NOR flash memory devices and NAND flash memory devices which have different methods of connecting memory cells with bit lines. In general, the NOR flash memory devices have the disadvantage that they require large currents. In comparison, the NAND flash memory devices require smaller cell currents than the NOR flash memory devices.

FIG. 1A is a circuit diagram of a NAND cell including a plurality of memory cells included in a conventional NAND flash memory device, and FIG. 1B is a circuit diagram of a plurality of memory cells in a conventional NOR-type flash memory device.

Referring to FIG. 1A, the conventional NAND flash memory device may include a plurality of memory cells M11 to M14 connected to word lines WL11 to WL14, respectively. The memory cells M11 to M14 together with selection transistors ST1 and ST2 constitute a NAND "string" structure. In contrast, referring to FIG. 1B, the conventional NOR flash memory device includes a first plurality of memory cells M21 to M23 connected in parallel to bit line BL1 and a common source line CSL. A second plurality of memory cells M24 to M26 are connected in parallel to bit line BL2 and a second common source line CSL. Since the NAND flash memory device (FIG. 1A) requires a smaller cell current, all memory cells connected to a single word line may be programmed at the same time. In contrast, since the NOR flash memory device requires a large current, only a predetermined number of memory cells may be programmed during a program operation.

As compared with other recording media such as hard disks, flash memory devices are highly reliable. In general, a failure occurs in at most one memory cell per write unit (e.g., per page unit). Accordingly, the manufacturers of flash memory devices are adopting error correction code (ECC) algorithms in order to correct data read from a defective memory cell during a read operation. For example, there are many cases where flash memory devices adopt ECC algorithms based on the Hamming codes, which are capable of detecting and correcting an 1-bit error in one error correction code (ECC) unit.

FIG. 2 is a block diagram of a cell array of a conventional flash memory device using an ECC algorithm.

Referring to FIG. 2, a memory cell array 10 includes data memory cells 11 for storing data and a parity memory cell 12 for storing a parity code required to correct an error. During a read operation, the parity code stored in the parity memory cell 12 is also read and transmitted to a block that performs the ECC algorithm. In order to increase a read efficiency, the conventional flash memory device is configured such that the data memory cells 11 share a bulk (active region) with the parity memory cell corresponding to the data memory cell 11.

A NAND flash memory device erases the memory cell array 10 before data is written therein. When the data memory cells 11 share the bulk with the parity cell 11, data stored in the data memory cells 11 may be erased along with a parity code stored in the parity cell 12. Thus, the parity code stored in the parity cell 12 cannot be used during an erase operation of the flash memory device, so that the ECC algorithm cannot be applied to the erase operation.

Conventionally, during the erase operation of the flash memory device threshold voltages of all the data memory cells 11 are controlled to be lower than a predetermined voltage. Also, after the erase operation, it is verified whether there is a data memory cell 11 whose threshold voltage is not lower than the predetermined voltage, and the erase operation is repeated until the threshold voltages of all the data memory cells 11 are sufficiently low. In that case, the erase operation is repeated even if a 1-bit error occurs in one error correction code (ECC) unit. As a result, when the threshold voltage of any one memory cell is not properly controlled, the entire erase operation may be failed, and an erase time may be increased due to repetition of the erase operation.

SUMMARY OF THE INVENTION

Various aspects of the invention provide flash memory devices capable of reducing the failure rate of an erase operation and of reducing an erase time and a method of operating the same devices. In some exemplary embodiments of the invention, a control logic restarts an erase operation on an erroneously unerased data memory cell or prevents the erase operation from being restarted based on the number of erroneous bits per ECC block.

According to an aspect of the invention, there is provided a flash memory device including: a memory cell array including a plurality of ECC blocks (e.g. pages). Each ECC block includes a plurality of data memory cells configured to store data and a parity cell configured to store a first parity code. The a flash memory device may further include a parity controller configured to generate a second parity code based on a result of detection of the current operating mode of the flash memory device; and an error correction unit configured to receive one of the first and second parity codes and perform an error correction code (ECC) algorithm on the data stored in the data memory cells using the received parity code.

The parity controller may generate the second parity code in response to the detection of an erase mode of the flash memory device.

The parity controller may receive the first parity code and selectively output one of the received first parity code and the generated second parity code.

The parity controller may selectively output the second parity code in during the erase mode of the flash memory device.

The second parity code may have a logic value for correcting an error in the data of data memory cells in which an erase operation has been performed.

The parity controller may include: a parity generator configured to generate the second parity code; a multiplexer configured to receive the first and second parity codes and output a selected one of the first and second parity codes to the error correction unit; and a controller configured to control the parity generator and the multiplexer based on the operating mode.

The controller may generate a first control signal for causing the parity generator to generate the second parity code and a second control signal for causing the multiplexer to selectively output the second parity code, in response to an erase mode of the flash memory device.

The parity controller may further include a mode detector that receives a signal indicating the operating mode of the flash memory device, detects the operating mode of the flash memory device, and outputs a mode detection signal to the controller.

The flash memory device may further include a control logic configured to control write, read, and erase operations of the memory cells in the flash memory device. During an erase operation of the flash memory device, the control logic may determine whether it is possible to correct an error in an erroneously unerased data memory cell and to terminate the erase operation on the erroneously unerased memory cell if it is determined that the error is correctable.

The control logic may determine whether it is possible to correct the error in the erroneous memory cell based on the number of erroneous (erroneously unerased) bits per ECC block of data.

The control logic may repeat the erase operation on the erroneously unerased data memory cells when the number of erroneous bits per ECC block exceeds a predetermined value, and terminate the erase operation on the erroneously unerased data memory cells when the number of erroneous bits per ECC block is equal to or below the predetermined value.

During a read operation of the flash memory device, the parity controller may further receive address information on a data memory cell from which data is to be read, and generate the second parity code based on the address information.

The parity controller may provide the first parity code to the error correction unit when the data memory cell from which data is to be read is a programmed cell, and generate the second parity code and provide the second parity code to the error correction unit when the data memory cell from which data is to be read is an erased cell.

According to another aspect of the invention, there is provided a flash memory device including: a memory cell array including a data memory cell and a parity cell; an error correction unit configured to receive data from the data memory cell, to perform an ECC algorithm on the data, and output error-corrected data; a parity controller configured to provide a first parity code read from the parity cell to the error correction unit or to internally generate a second parity code and provide the second parity code to the error correction unit depending on the current operating mode; and a control logic configured to restart an erase operation on an erroneous data memory cell or to prevent the erase operation from being restarted depending on the number of erroneous (erroneously unerased) bits per ECC block.

According to another aspect of the invention, there is provided a method of operating a flash memory device including an error correction unit. The method includes: performing an erase operation on an error correction code (ECC) block of memory cells; determining the number of erroneous (erroneously unerased) bits among block of data; and terminating the erase operation (inhibiting repeating the erase operation) on erroneous data memory cells when the number of erroneous bits is equal to or below a predetermined value.

The invention will be described more fully hereinafter with reference to the accompanying drawings, in which exemplary embodiments are shown. The same reference numerals are used to denote the same elements throughout the specification.

BRIEF DESCRIPTION OF THE DRAWINGS

Exemplary embodiments of the invention will be more clearly understood from the following detailed description taken in conjunction with the accompanying drawings in which.

DETAILED DESCRIPTION OF THE EXEMPLARY EMBODIMENTS OF THE INVENTION

Figure 1A:
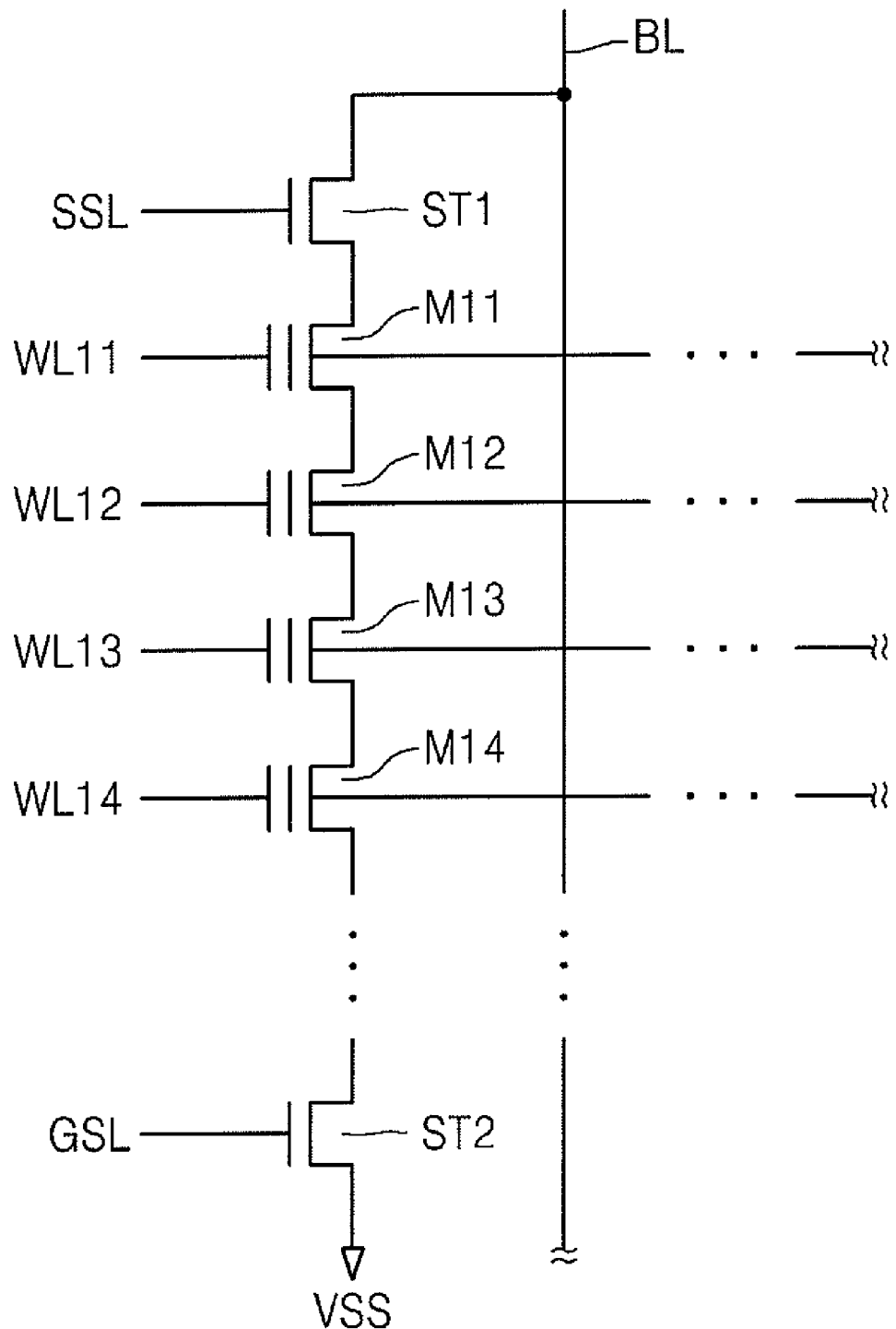
FIG. 1A is a circuit diagram of a NAND cell including a plurality of memory cells in a conventional NAND-type flash memory device.
Figure 1B:
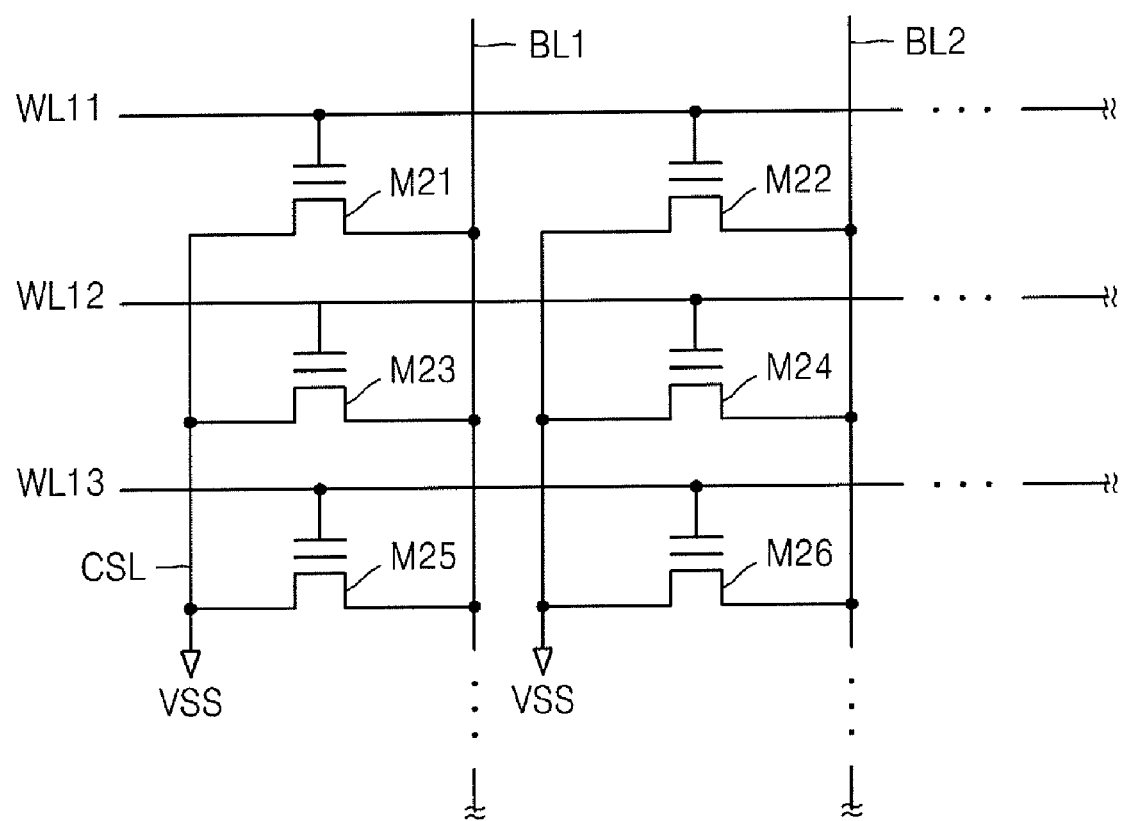
FIG. 1B is a circuit diagram of a plurality of memory cells in a conventional NOR-type flash memory device.
Figure 2:
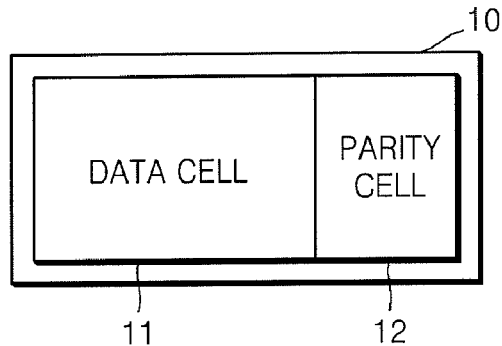
FIG. 2 is a block diagram of a cell array of a conventional flash memory device using an error correction code (ECC) algorithm.
Figure 3:
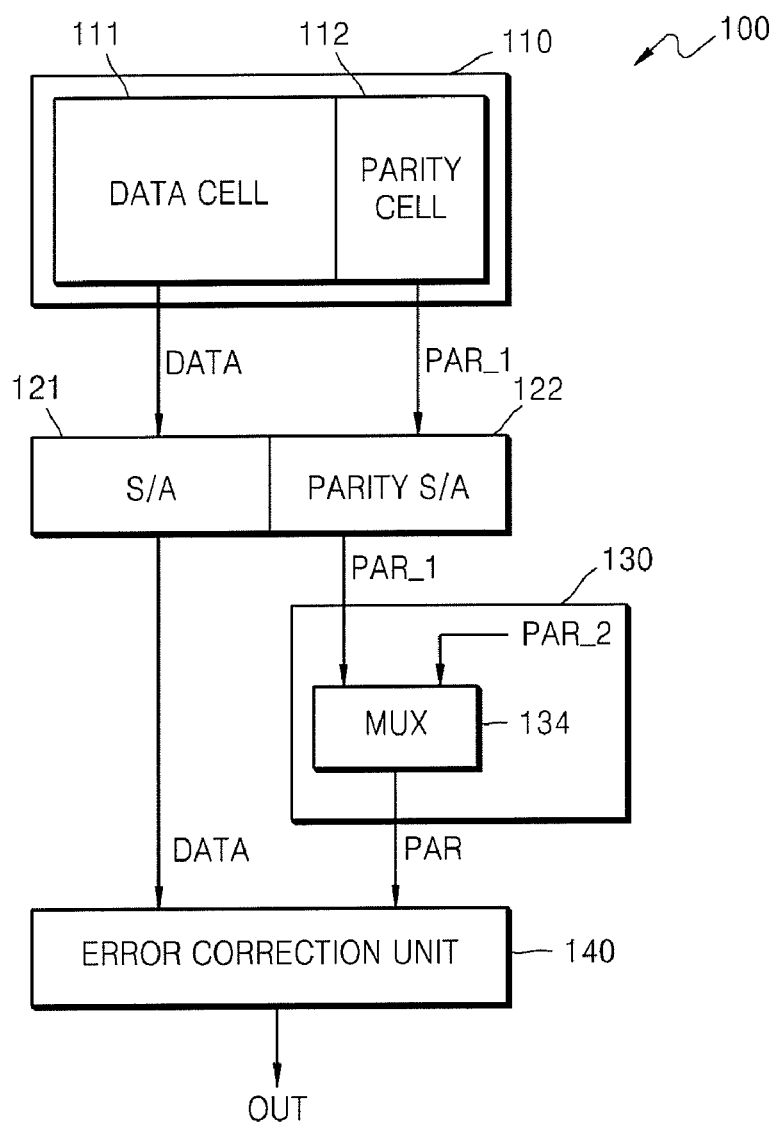
FIG. 3 is a block diagram of a flash memory device 100 according to an exemplary embodiment of the invention.

FIG. 3 is a block diagram of a flash memory device 100 according to an exemplary embodiment of the invention. Referring to FIG. 3, a flash memory device 100 may include a memory cell array 110 and peripheral circuits for performing program, read, and erase operations on the memory cells in the memory cell array 110. The memory cell array 110 may include a plurality of data memory cells 111 for storing data DATA and a corresponding parity cell 112 for storing a corresponding first parity code PAR_1 required for an error correction code (ECC) algorithm. The flash memory device 100 may include a parity generator (not shown) for generating the first parity code PAR_1. The parity generator may generate the first parity code PAR_1 corresponding to an ECC block of data (e.g., a page of data), and the generated first parity code PAR_1 may be stored in the parity cell 112. In general, the flash memory device 100 may adopt an ECC algorithm based on the Hamming code. In this case, a 1-bit error per ECC block of data may be detected and corrected using information of the first parity code PAR_1.

Meanwhile, the flash memory device 100 may include various peripheral circuits for performing various functions. For example, the flash memory device 100 may include a data sense amplifier (S/A) 121, a parity sense amplifier 122, and an error correction unit 140. The data sense amplifier 121 senses and amplifies data DATA read from the data memory cell 111, and the parity sense amplifier 122 senses and amplifies the first parity code PAR_1 read from the parity cell 112. Also, the error correction unit 140 may perform the ECC algorithm using the data DATA and a received parity code PAR and output error-corrected data. As shown in FIG. 3, the error correction unit 140 may receive the first parity code PAR_1 or a second parity code PAR_2 and perform the ECC algorithm using the received parity code PAR. Also, the flash memory device 100 according to various exemplary embodiments may further include a parity controller 130 for controlling the parity code PAR to be provided to the error correction unit 140.

The parity controller 130 generates the second parity code PAR_2 based on a result of detecting the current operating mode of the flash memory device 100. If the flash memory device 100 performs an erase operation, the parity controller 130 may detect an erase mode and then generates the second parity code PAR_2. The second parity code PAR_2 may be a parity code required for correcting an error in data stored in the erased data memory cell 111. Since erased data has a predetermined value (e.g., data "1"), the parity controller 130 may be set to generate the second parity code PAR_2 in a predetermined pattern in response to the erase mode. If the flash memory device 100 performs a read operation on programmed data, the parity controller 130 may detect a read mode and selectively output the first parity code PAR_1 read from the parity cell 112.

The error correction unit 140 may receive one of the first and second parity codes PAR_1 and PAR_2 and perform the ECC algorithm on received data DATA using the received parity code PAR. The providing of the parity code PAR to the error correction unit 140 may be controlled by the parity controller 130. The parity controller 130 may receive the first parity code PAR_1 from the parity sense amplifier 122 and selectively output one of the received first parity code PAR_1 and the internally generated second parity code PAR_2 to the error correction unit 140.

In order to enable the above-described operations, the parity controller 130 includes a multiplexer 134. The multiplexer 134 receives the first parity code PAR_1 through a first input terminal and receives the second parity code PAR_2 through a second input terminal. Also, the multiplexer 134 selectively outputs one of the first and second parity codes PAR_1 and PAR_2 (based on the result of detection of the operating mode of the flash memory device 100). When the flash memory device 100 performs a read operation on programmed data, the multiplexer 134 may selectively output the first parity code PAR_1 read from the parity cell 112 corresponding to the stored data. In contrast, when the flash memory device 100 performs an erase operation, the multiplexer 134 may selectively output the second parity code PAR_2 generated in the parity controller 130.

The read operation of the flash memory device 100 proceeds as follows. Data DATA read from the data memory cell 111 of the memory cell array 110 is provided through the data sense amplifier 121 to the error correction unit 140. Also, the first parity code PAR_1 corresponding to the data DATA may be read from the parity cell 112 and provided through the parity sense amplifier 122 to the parity controller 130. The parity controller 130 may output the first parity code PAR_1 to the error correction unit 140 during a detected read mode of the flash memory device 100.

The error correction unit 140 may perform the ECC algorithm using the data DATA and the first parity code PAR_1 read from the data memory cell 111 and the parity cell 112, respectively, and output error-corrected data. When the Hamming-code-based ECC algorithm is applied, a 1-bit error in per ECC block of data may be detected and corrected using information of the first parity code PAR_1.

The erase operation of the flash memory device 100 according to an exemplary embodiment of the invention will now be described with reference to FIG. 4A, which is a detailed block diagram of the parity controller 130 in the flash memory device of FIG. 3.

Figure 4A:
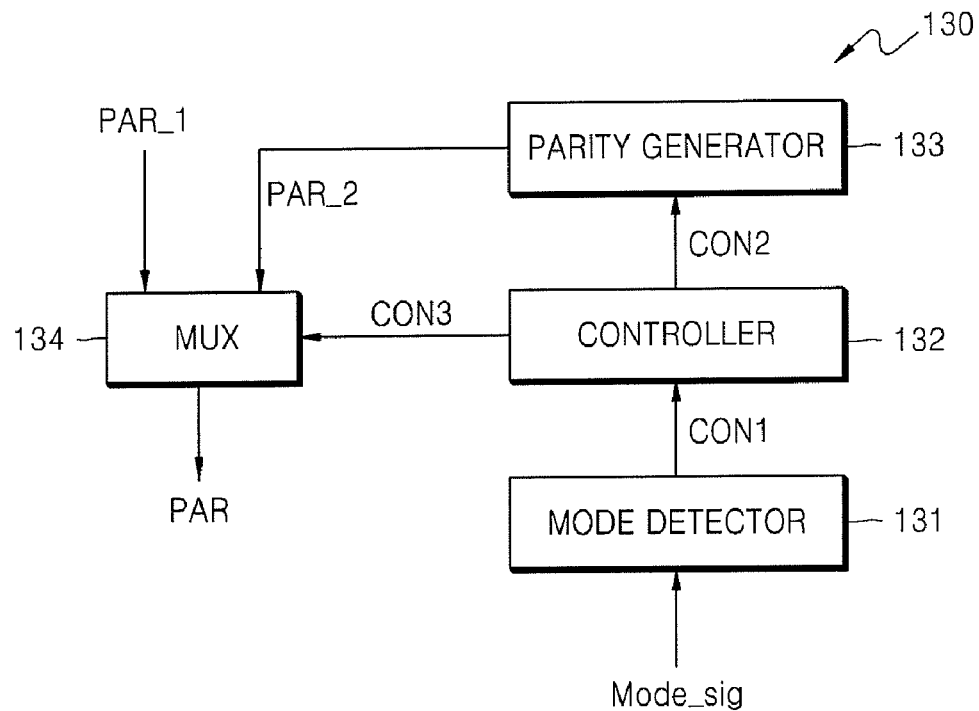
FIGS. 4A and 4B block diagrams of alternative implementations of the parity controller 130 in the flash memory device of FIG. 3.

Referring to FIG. 4A, the parity controller 130 includes a mode detector 131, a controller 132, a parity generator 133, and the multiplexer 134. The mode detector 131 receives mode signal Mode_sig having information about the current operating mode of the flash memory device 100, generates a control signal CON1 in response to the mode signal Mode_sig, and transmits the control signal CON1 to the controller 132. For example, when the flash memory device 100 operates in an erase mode, the mode detector 131 may transmit a control signal CON1 having a first level to the controller 132 and, when the flash memory device 100 operates in another mode (e.g., a read mode or a program mode), the mode detector 131 may transmit a control signal CON1 having a second level to the controller 132.

The controller 132 controls the entire operation of the parity controller 130 in response to the control signal CON1 from the mode detector 131. For example, the controller 132 may generate a second control signal CON2 required for controlling the parity generator 133 and a 1-bit third control signal CON3 required for controlling the multiplexer 134 in response to the first control signal CON1. In the erase mode, the controller 132 may cause the parity generator 133 to generate the second parity code PAR_2 in response to the control signal CON1 having the first level. As described above, the second parity code PAR_2 may be a parity code required for correcting an error in data stored in the erased data memory cell 111.

The multiplexer 134 selectively outputs one of the first parity code PAR_1 read from the parity cell 112 and the second parity code PAR_2 generated by the parity generator 133. Specifically, when the flash memory device 100 operates in the erase mode, the multiplexer 134 receives the second parity code PAR_2 and outputs the second parity code PAR_2 to the error correction unit 140 in response to the third control signal CON3 generated by the controller 132. In contrast, when the flash memory device 100 operates in another operating mode, for example, the read mode, the multiplexer 134 outputs the first parity code PAR_1 read from the parity memory cell 112 to the error correction unit 140.

Since the above-described flash memory device 100 according to the exemplary embodiment employs parity codes generated by different circuit blocks according to its operating mode, it can perform the ECC algorithm by appropriately using the parity codes even in the erase mode. Thus, in an operating mode (e.g., a read mode) other than the erase mode, the flash memory device 100 may read data from the data memory cells 111, read the corresponding first parity code PAR_1 from the parity cell 112, and perform the ECC algorithm on the data. Also, in the erase mode, the flash memory device 100 may perform the ECC algorithm on the erased data memory cell 111 using the second parity code PAR_2 generated by the parity generator 133.

When one of the data memory cells 111 on which the erase operation is performed is not erased (when there is one data memory cell 11 whose threshold voltage is not lower than the predetermined voltage), an error of erroneous data may be corrected and error-corrected data may be output instead of repeating the erase operation on the data memory cell 111. Assuming that an error in one bit per ECC block may be corrected using the ECC algorithm, when an error occurs in one bit of an ECC block of the erased data memory cell 111, data may be corrected using the ECC algorithm and corrected data may be output. Therefore, it is possible to prevent unnecessary repetition of erase operations.

Thus, one of the first and second parity codes PAR_1 and PAR_2 is selectively provided to the error correction unit 140 in response to the mode signal Mode_sig, specifically, the second parity code PAR_2 is provided to the error correction unit 140 in response to the erase mode. Although, in the above exemplary embodiment, the parity controller 130 is controlled in response to the mode signal Mode_sig, the parity controller 130 may be further or alternatively controlled in response to an address information signal Add_sig in the read mode, as will now be described with reference to FIG. 4B.

Figure 4B:
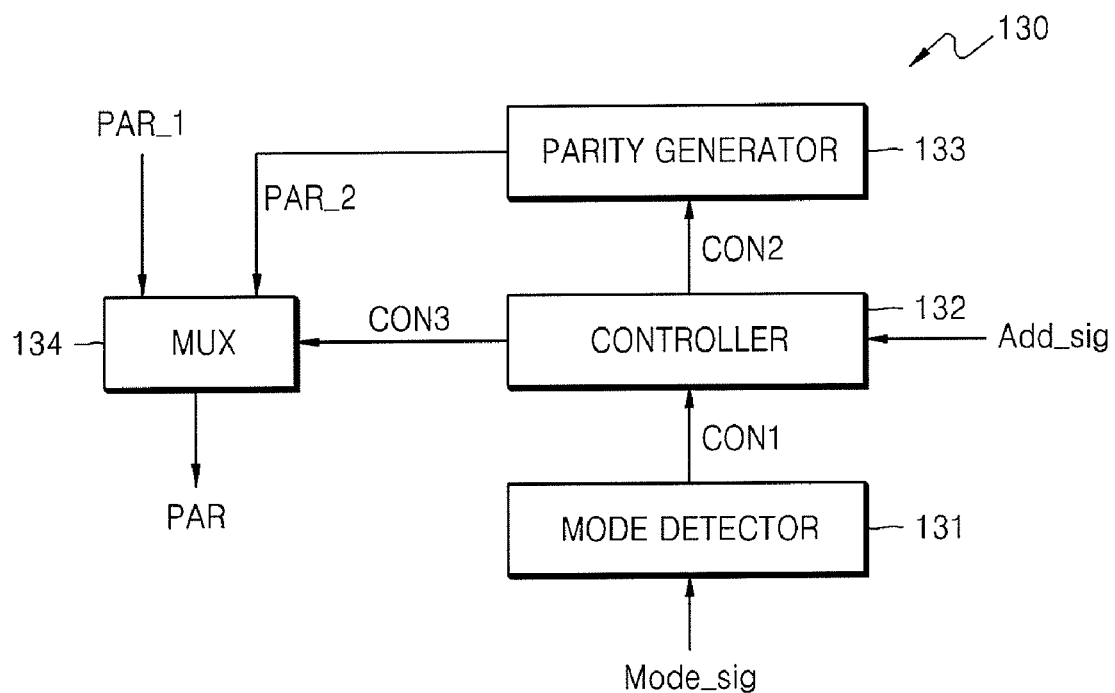

FIG. 4B is a detailed block diagram of an alternative implementation 130B of the parity controller 130 in the flash memory device of FIG. 3. The parity controller 130B of FIG. 4B is generally the same as the parity controller 130 of FIG. 4A except that the parity controller 130B of FIG. 4B further receives an address information signal Add_sig and controls the output of the parity code PAR while in the read mode.

As described above, the parity controller 130B selectively provides one of the first and second parity codes PAR_1 and PAR_2 to the error correction unit 140 (FIG. 3) in response to the mode signal Mode_sig. For example, the parity controller 130 provides the second parity code PAR_2 to the error correction unit 140 while in the erase mode. In addition, the parity controller 130 of FIG. 4B provides the first parity code PAR_1 or the second parity code PAR_2 to the error correction unit 140 in response to the address information signal Add_sig while in the read mode.

When a block of the memory cell array 110 is erased, the parity cell 112 corresponding to the erased block is also erased. Thus, when data is read from the erased data memory cells 111, the ECC algorithm cannot be performed using the parity code PAR_2 stored in the parity memory cell 112. As a result, when a cell to be read is included in the erased block, i.e., when the cell to be read is an erased data memory cell, the parity controller 130 may generate the second parity code PAR_2 in response to the address information signal Add_sig and provide the generated second parity code PAR_2 to the error correction unit 140. Thus, as described above, even if an error occurs in a predetermined number of bits (e.g., one bit or less) per ECC block in the erase mode, the erase mode is terminated. Afterwards, when the erased data memory cell is read during a read operation, erroneous data may be corrected using the second parity code PAR_2.

On the other hand, when a memory cell to be read is not included in the erased block, i.e., when the cell to be read is a programmed data memory cell, the parity controller 130 may provide the first parity code PAR_1 received from the parity memory cell 112 to the error correction unit 140 in response to the address information signal Add_sig. In this case, the controller 132 disables the parity generator 133 and prevents generation of the second parity code PAR_2.

Meanwhile, it is possible to correct an error in stored data using a parity code PAR when errors occur in a predetermined number of bits (e.g., one bit or less) per ECC block. Thus, when an error occurs in the erased data memory cell 111, it is determined whether it is possible to correct the error, and it is then decided whether to restart an erase operation on the data memory cell 111 or perform the ECC algorithm on data without repeating the erase operation based on the determination result.

Figure 5:
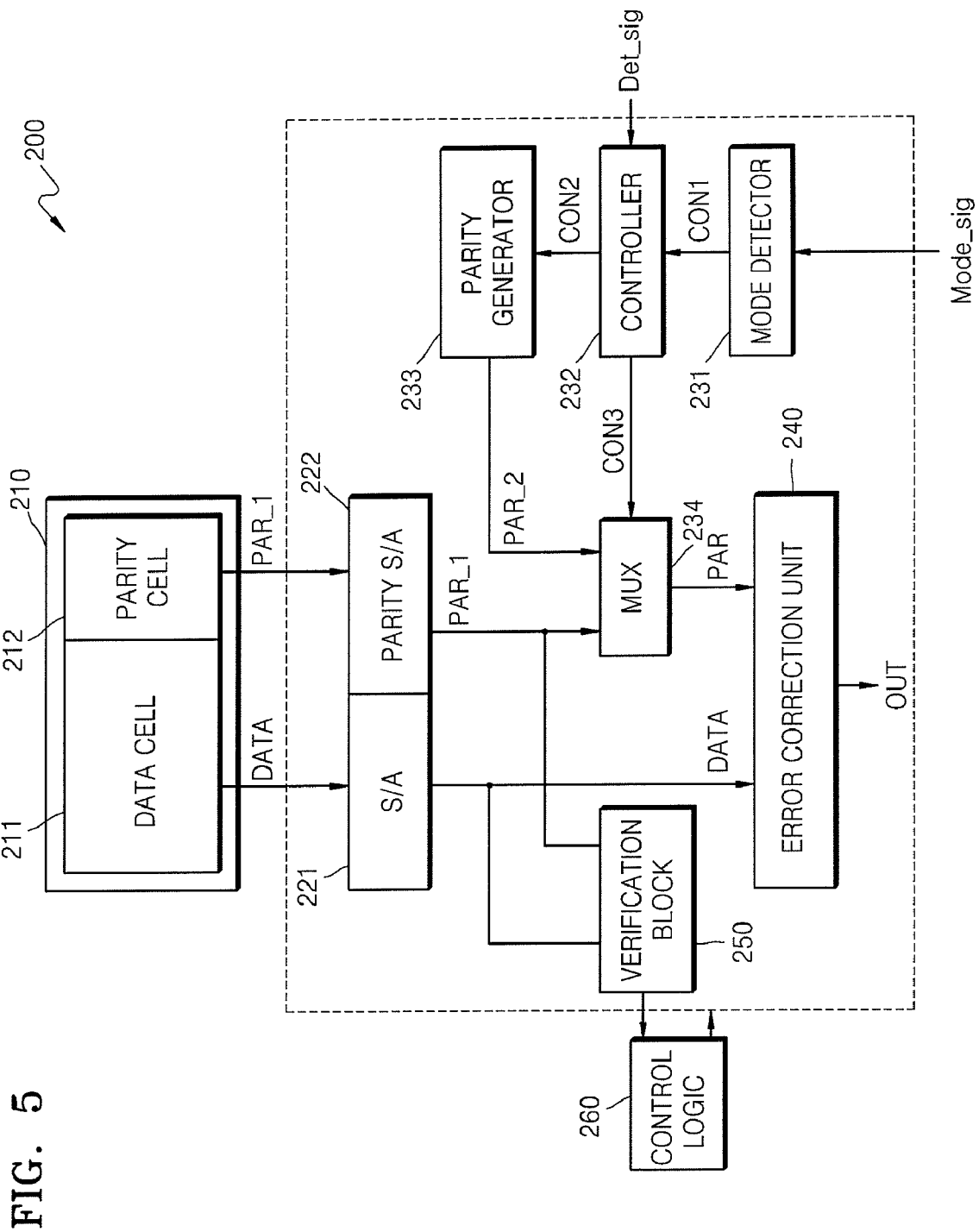
FIG. 5 is a block diagram of a flash memory device 200 according to another exemplary embodiment of the invention.

FIG. 5 is a block diagram of a flash memory device according to another exemplary embodiment of the invention. Referring to FIG. 5, a flash memory device 200 may include a memory cell array 210, peripheral circuits, and a control logic 260. The memory cell array 210 may include data memory cells 211 and a parity memory cell 212. The peripheral circuits may perform read, program, and erase operations on the memory cell array 210. The control logic 260 may control the entire operation of the peripheral circuit. Also, the peripheral circuits may include a data sense amplifier (S/A) 221, a parity sense amplifier 222, an error correction unit 240, and a verification block 250. The flash memory device 200 may further include a parity controller, which includes a mode detector 231, a controller 232, a parity generator 233, and a multiplexer 234. In FIG. 5, since the same numbered circuit blocks have the same functions as those of FIG. 3, the functions thereof would be easily understood with reference to FIG. 3 without repeating their description. Therefore, a redundant description of the same circuit blocks will be omitted here.

In a read mode of the flash memory device 200, the control logic 260 controls the peripheral circuits to read data DATA stored in the memory cell array 210. Under the control of the control logic 260, the data DATA may be read from the data memory cells 211 of the memory cell array 210 and provided through the data sense amplifier 221 to the error correction unit 240. Also, the mode detector 231 transmits a control signal CON1 to the controller 232 in response to a mode signal Mode_sig having information about an operating mode. The controller 232 enables or disables the parity generator 233 in response to the control signal CON1. Also, the controller 232 causes the multiplexer 234 to provide a selected on of the first parity code PAR_1 or the second parity code PAR_2 to the error correction unit 240.

Although not shown in FIG. 5, as previously described above, the controller 232 may further receive an address information signal Add_sig in the read mode. Also, when data to be read is stored data, the multiplexer 234 provides the first parity code PAR_1 corresponding to the data in the error correction unit 240. In contrast, when data to be read is erased data, the parity generator 233 generates the second parity code PAR_2 and the multiplexer 234 provides the second parity code PAR_2 to the error correction unit 240.

The error correction unit 240 corrects an error in the data DATA using the received parity code PAR. When errors occur in a predetermined number of bits (e.g., one bit) or less per ECC block of read data DATA, data whose error is corrected by the ECC algorithm may be output from the error correction unit 240.

Meanwhile, in an erase mode of the flash memory device, the control logic 260 controls the peripheral circuits to erase data stored in the memory cell array 210. First, an erase operation may be performed on the data memory cells 211 included in the memory cell array 210. When the data memory cells 211 share a bulk (active region) with the parity cell 212, the data memories cell 211 and the parity cell 212 may be erased at the same time.

After the erase operation, it is verified that the threshold voltage of all memory cell transistors included in the erased data memory cells 211 became lower than a predetermined reference voltage. Data DATA read from the data memory cells 211 may be provided to the verification block 250 shown in FIG. 5 so that a verification operation may be performed on the data memory cells 211. Also, it is possible to perform a verification operation on memory cell transistors included in the data memory cells 211 and in the parity memory cell 212. In order to enable the verification operation, the result of reading of the data memory cells 211 and the parity memory cell 212 is provided to the verification block 250.

The verification block 250 outputs a result of verification of data read from the data memory cells 211 and/or the parity cell 212 to the control logic 260. The control logic 260 controls the peripheral circuits such that the erase operation is repeated on the memory cell array 210 or the ECC algorithm is performed on erroneous data without repeating the erase operation based on the verification result. The control logic 260 determines whether it is possible to correct an error in an ECC block of data and prevents repetition of the erase operation on the memory cell array 210 when it is determined that error correction is possible. Thus, the control logic 260 determines whether the number of erroneous bits per ECC block is the equal to or less than the predetermined number of bits (critical number of bits) correctable by the ECC algorithm, and causes the error correction unit 240 to correct the erroneous bits instead of restarting the erase operation on an erroneous data memory cell when it is determined that the number of erroneous bits per ECC block is equal to or less than the number of bits correctable by the ECC algorithm.

When the number of erroneous bits per ECC block exceeds the predetermined critical value, the erase operation is repeated on the memory cell array 210. After the erase operation is restarted, the verification block 250 may perform the verification operation on the data memory cells 211 and/or the parity memory cell 212 and output a verification result to the control logic 260. When the number of erroneous bits per ECC block becomes equal to or less than the critical value due to the re-erase operation, the control logic 260 may terminate repeating the erase operation on the memory cell array 210 and cause the error correction unit 240 to perform the ECC algorithm on the ECC block of data.

The controller 232 for controlling the operation of the parity controller may control the parity generator 233 and the multiplexer 234 under the above-described control of the control logic 260. In order to control the parity generator 233 and the multiplexer 234, the controller 232 may receive not only the control signal CON1 transmitted from the mode detector 231 but also a control signal Det_sig indicating that it is possible to correct an error in the current ECC block of data. The control signal Det_sig may be provided by the control logic 260.

The controller 232 may control the parity generator 233 and the multiplexer 234 in response to the control signal CON1 and the control signal Det_sig. Specifically, when the flash memory device 200 operates in the erase mode and it is possible to correct a data error in an ECC block of data by using the ECC algorithm, the controller 232 may enable the parity generator 233 to generate the second parity code PAR_2. Also, the generated second parity code PAR_2 may be provided to an input terminal of the multiplexer 234, and the controller 232 may cause the multiplexer 234 to provide the second parity code PAR_2 to the error correction unit 240.

In the above-described operation, it is unnecessary to repeat the erase operation in order to obtain threshold voltages of all memory cells on which the erase operation is performed lower than the predetermined reference voltage. In other words, an error correction operation is performed on a smaller number of unerased memory cells instead of repeating the erase operation. As a result, unnecessary repetition of erase operations can be prevented, thereby shortening the erase time. In addition, it is possible to prevent the entire erase operation from being failed due to the small (correctable) number of error memory cells.

Figure 6:
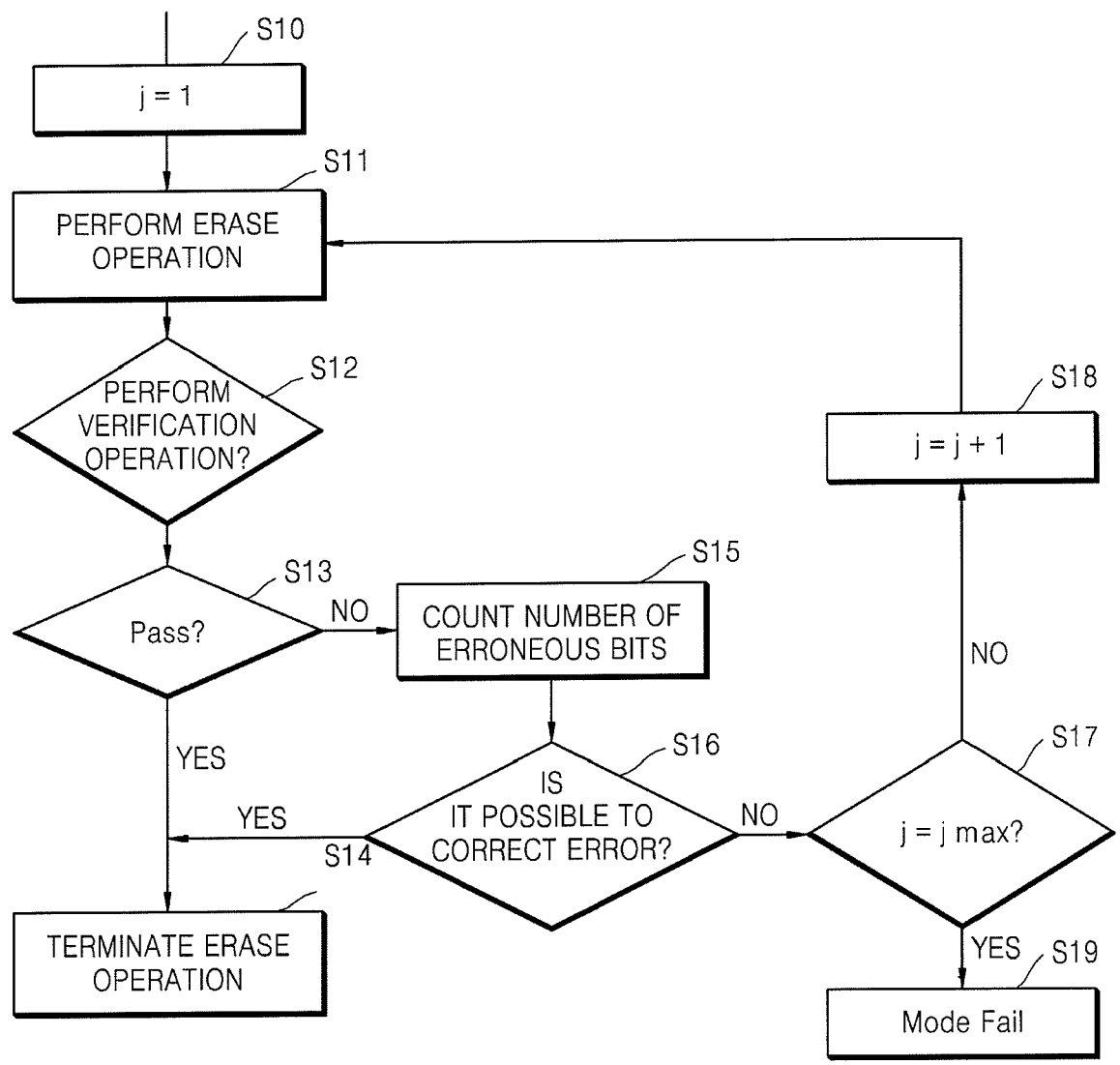
FIG. 6 is a flowchart illustrating a method of operating a flash memory device according to an exemplary embodiment of the invention.

FIG. 6 is a flowchart illustrating a method of operating a flash memory device according to an exemplary embodiment of the invention. FIG. 6 illustrates a method of performing an erase operation using an ECC algorithm. Initially, a loop count j is initialized in step S10. When the flash memory device operates in an erase mode, memory cells of a memory cell array are erased in step S11. After an erase operation is finished, the memory cells are verified in verification step S12. In verification step S12, a verification operation may be performed by determining whether threshold voltages of the memory cells of the memory cell array are equal to or below a reference voltage.

In the verification operation in step S13, it is determined whether the memory cells pass or fail. When it is determined that the memory cells pass the verification operation (YES branch of decision step S13), since the threshold voltages of all the erased memory cells are equal to or below the reference voltage, the erase operation on the corresponding memory block is terminated in termination step S14. On the other hand, when it is determined that the memory cells fail in the verification operation (NO branch of decision step S13), because some of the memory cells on which the erase operation is performed are not yet erased, the erase operation may be repeated so that the threshold voltages of the unerased memory cells can be lower than the reference voltage or an error in erroneous data may be corrected using the ECC algorithm and error-corrected data may be output without repeating the erase operation.

When it is determined that the verification operation is failed (NO branch of decision step S13), the number of erroneous (unerased) bits in an ECC block of data is counted in bit counting step S15. The number of erroneous bits may be equal to the number of unerased memory cells. However, when a memory cell array included in the flash memory device includes multi-level cells, there may be at least two erroneous bits in one memory cell.

Meanwhile, after the number of erroneous bits is counted in step S15, it is decided in ECC decision step S16 whether it is possible to correct an error using the ECC algorithm based on a count result. For example, assuming that it is possible to correct an error in one bit per ECC block using the ECC algorithm, if the number of erroneous bits is "1", it is decided that it is possible to correct the error. After it is decided that it is possible to correct the error (YES branch of decision step S16), a re-erase operation on one erroneous cell is prevented by termination step S14. Thereafter, the ECC algorithm is performed on erroneous data and error-corrected data is output.

However, when it is decided that it is not possible to correct errors based on the count result (NO branch of decision step S16), the erase operation on the corresponding memory cell is restarted. The maximum loop value jmax may be set (e.g., predetermined) in relation to the number of times the erase operation would conventionally be repeated, or less, or more. The loop count value j is compared to the maximum loop value jmax and it is thereby decided whether the number of times j the corresponding memory cell has been erased or re-erased equals the maximum loop value jmax in decision step S17. When it is decided that the number of times j the erase operation is repeated is below the maximum loop value jmax (NO branch of decision step S17), the erase operation is again performed (restarted) on the corresponding memory cell in step S11. When the erase operation is restarted, the loop value j, which is compared with the maximum loop value jmax, is incremented in step S18. After the erase operation is restarted in step S11, the verification step S12, the pass/failure determination step S13, and the error correctability (ECC) decision step S16 are repeated. When the number of times j the erase operation is repeated equals the maximum loop value jmax (YES branch of decision step S17), it is finally decided that the corresponding erase mode is failed and the erase operation terminates in mode-fail termination step S19.

While the invention has been particularly shown and described with reference to exemplary embodiments thereof, it will be understood that various changes in form and details may be made therein without departing from the spirit and scope of the following claims.

What is claimed is:

1. A flash memory device comprising:
a memory cell array including a data memory cell configured to store data and a parity memory cell configured to store a first parity code;
a parity controller configured to generate a second parity code based on a result of detection of an operating mode of the flash memory device; and
an error correction unit configured to receive one of the first and second parity codes and to perform an error correction code (ECC) algorithm on the data stored in the data memory cell using the received parity code.

2. The device of claim 1, wherein the parity controller generates the second parity code while the detected operating mode is an erase mode of the flash memory device.

3. The device of claim 2, wherein the parity controller receives the first parity code and selectively outputs one of the received first parity code and the generated second parity code.

4. The device of claim 3, wherein the parity controller selectively outputs the second parity code while the detected operating mode is the erase mode of the flash memory device.

5. The device of claim 4, wherein the second parity code has a logic value for correcting an error in the data stored in the data memory cell on which an erase operation has been performed.

6. The device of claim 1, wherein the parity controller comprises:
a parity generator configured to generate the second parity code;
a multiplexer configured to receive the first and second parity codes and to output one of the first and second parity codes to the error correction unit; and
a controller configured to control the parity generator and the multiplexer based on the result of detection of the operating mode.

7. The device of claim 6, wherein the controller generates a first control signal for causing the parity generator to generate the second parity code and a second control signal for causing the multiplexer to selectively output the second parity code, while the detected operating mode is an erase mode of the flash memory device.

8. The device of claim 6, wherein the parity controller further comprises a mode detector configured to receive a signal indicating the operating mode of the flash memory device, to detect the operating mode of the flash memory device, and to output a mode detection signal to the controller.

9. The device of claim 1, further comprising a control logic configured to control write, read, and erase operations of the flash memory device,
wherein during an erase operation of the flash memory device, the control logic determines whether an error in the data stored in the data memory cell is correctable and terminates the erase operation on the erroneous data memory cell when it is determined that the error is correctable.

10. The device of claim 9, wherein the control logic determines whether it the error in the data memory cell is correctable based on the number of erroneous bits per ECC block of data.

11. The device of claim 10, wherein the control logic repeats the erase operation on the erroneous data memory cell when the number of erroneous bits per ECC block exceeds a predetermined value, and terminates the erase operation on the erroneous data memory cell when the number of erroneous bits per ECC block is equal to or below the predetermined value.

12. The device of claim 1, wherein during a read operation of the flash memory device, the parity controller further receives address information about the data memory cell from which data is to be read, and generates the second parity code based on the address information.

13. The device of claim 12, wherein the parity controller provides the first parity code to the error correction unit if the data memory cell from which data is to be read is a programmed data memory cell, and generates the second parity code and provides the second parity code to the error correction unit if the data memory cell from which data is to be read corresponds is an erased data memory cell.

14. A flash memory device comprising:
a memory cell array including a data memory cell and a parity memory cell;
an error correction unit configured to perform an error correction code (ECC) algorithm on data received from the data memory cell, and to output error-corrected data;
a parity controller configured to provide a first parity code read from the parity memory cell to the error correction unit while in a first operating mode and to generate and provide a second parity code to the error correction unit while in a second operating mode; and
a control logic configured to restart an erase operation on an erroneously unerased data memory cell or prevent the erase operation from being restarted based on the number of erroneous bits per ECC block.

15. The device of claim 14, wherein the parity controller comprises:
a controller configured to generate a first control signal based on the current operating mode;
a parity generator configured to generate the second parity code; and
a multiplexer configured to receive the first and second parity codes and selectively output one of the first and second parity codes in response to the control signal generated by the controller; and
a mode detector configured to detect the operating mode of the flash memory device and to generate a mode detection signal to the controller.

16. The device of claim 15, wherein the controller generates a first control signal further based on the number of erroneous bits per ECC block.

17. A method of operating a flash memory device including an error correction unit, the method comprising:
performing an erase operation on a error correction code (ECC) block of memory cells;
determining the number of erroneously unerased bits among data memory cells in the error correction code (ECC) block; and
if the number of erroneous bits is equal to or below a predetermined value terminating the erase operation without re-erasing the erroneously unerased data memory cells.

18. The method of claim 17, further comprising restarting the erase operation on the erroneously unerased data memory cells if the number of erroneously unerased bits exceeds the predetermined value.

19. The method of claim 17, wherein the (ECC) block of memory cells includes a parity memory cell configured to store a first parity code,
the method further comprising:
generating a second parity code based on the current operating mode of the flash memory device; and selectively outputting one of the first and second parity codes to the error correction unit based on the current operating mode of the flash memory device.

20. The method of claim 19, wherein the second parity code is generated while in an erase mode of the flash memory device and is output to the error correction unit to correct an error in data of the erroneously unerased data memory cells.

* * * * *